(12) United States Patent
Koo et al.

(10) Patent No.: US 8,081,788 B2
(45) Date of Patent: Dec. 20, 2011

(54) SHIELDING DEVICE FOR A HEARING AID

(75) Inventors: Wee Haw Koo, Singapore (SG); Meng Kiang Lim, Singapore (SG)

(73) Assignee: Siemens Medical Instruments Pte. Ltd., Singapore (SG)

( * ) Notice: Subject to any disclaimer, the term of this patent is extended or adjusted under 35 U.S.C. 154(b) by 576 days.

(21) Appl. No.: 12/274,703

(22) Filed: Nov. 20, 2008

(65) Prior Publication Data

US 2009/0136068 A1 May 28, 2009

(30) Foreign Application Priority Data

Nov. 20, 2007 (DE) .......................... 10 2007 055 385

(51) Int. Cl.
*H04R 25/00* (2006.01)
(52) U.S. Cl. .................... 381/322; 381/189; 381/312
(58) Field of Classification Search .................... 381/72, 381/324, 322, 189, 312; 257/723, 685, 686, 257/508, 659; 361/749; 174/254
See application file for complete search history.

(56) References Cited

U.S. PATENT DOCUMENTS

| | | | | |
|---|---|---|---|---|
| 6,665,191 | B2 * | 12/2003 | Blood et al. | ................. 361/749 |
| 7,181,034 | B2 | 2/2007 | Armstrong | |
| 2005/0041399 | A1 * | 2/2005 | Youker et al. | ................. 361/749 |
| 2006/0093174 | A1 | 5/2006 | Niederdrank et al. | |

FOREIGN PATENT DOCUMENTS

| | | |
|---|---|---|
| CA | 2382362 A1 | 10/2002 |
| DE | 19544345 C1 | 2/1997 |
| DE | 19904105 C1 | 7/2000 |
| DE | 102004051226 B3 | 1/2006 |
| DE | 60209161 T2 | 10/2006 |
| EP | 0852451 A2 | 7/1998 |

* cited by examiner

*Primary Examiner* — Jasmine Clark
(74) *Attorney, Agent, or Firm* — Laurence A. Greenberg; Werner H. Stemer; Ralph E. Locher

(57) ABSTRACT

A shielding device for a hearing aid is able to shield components against interference from the outside and vice versa. The shielding device has at least three sections, which are each connected to one another via a flexible connecting section. It being possible for at least a first section to be provided with a printed circuit board and to be populated with at least one component and/or an integrated circuit, it being possible for the two other sections to be folded around the first section by the flexible connecting sections, in order to shield the first section.

20 Claims, 2 Drawing Sheets

SHIELDING DEVICE FOR A HEARING AID

CROSS-REFERENCE TO RELATED APPLICATION

This application claims the priority, under 35 U.S.C. §119, of German application DE 10 2007 055 385.6, filed Nov. 20, 2007; the prior application is herewith incorporated by reference in its entirety.

BACKGROUND OF THE INVENTION

Field of the Invention

The invention relates to a shielding device for a hearing aid and a hearing aid having such a device.

The prior art found in German patent translation DE 602 09 161 T2, corresponding to U.S. Pat. No. 7,181,034, discloses a digital hearing aid, for example. In this case, the hearing aid has an integrated circuit (IC). On the integrated circuit (IC) there are many circuit blocks and system elements. These include, for example, a controller, a loudness controller A/D, an interface/system controller, an EEPROM memory, a turn-on-reset circuit and an oscillator/system clock. Furthermore, the hearing aid has a plurality of external components, such as two microphones, a tele-coil, a loudness control potentiometer, a memory selection switch, battery terminals and a loudspeaker. In this case, sound is received by the two microphones and converted into electric signals, which are injected at inputs of the integrated circuit. The tele-coil is in this case a device which is coupled magnetically to a telephone earpiece and generates an input current proportional to the telephone signal. It is used to prevent acoustic feedback into the system when speaking on the telephone.

However, the hearing aid described above has the disadvantage that, for example, it is possible for undesired magnetic influences to arise because of the tele-coil. Furthermore, noise interference can be produced by the oscillator as a clock generator.

Moreover, German patent DE 10 2004 051 226 B3, corresponding to U.S. patent publication No. 2006/0093174, discloses a hearing aid which has a microphone for picking up an acoustic input signal and converting it into an electric signal. The latter is then fed to a signal processing unit constructed as a hybrid component for further processing and amplification. In this case, the hearing aid contains an antenna or coil for the wire-free transmission of electromagnetic signals between the hearing aid and a further device, for example a second hearing aid to provide for the user binaurally. In each case conductor loops are laid around the hybrid component and the antenna, so that electromagnetic interference fields caused by supply lines or components are compensated for at the location of the antenna or coil.

German patent DE 199 04 105 C1 discloses a hearing aid having a shielded circuit arrangement. The circuit arrangement contains a semiconductor subassembly, which is shielded on several sides against electromagnetic interference radiation. The circuit arrangement is implemented as a multilayer circuit board and contains a layer having a shielding action, which covers the semiconductor subassembly.

German patent DE 195 44 345 C1 discloses a hearing aid which contains active components in an amplifier and transmission circuit. In order to improve the immunity to interference against high-frequency electromagnetic interference signals, an electromagnetic shield is provided.

Published, European patent application EP 0 852 451 A2 discloses a hearing aid which contains a multilayer circuit board. For the purpose of electromagnetic shielding of the circuit arrangement, this is covered with a potential-forming compound.

SUMMARY OF THE INVENTION

It is accordingly an object of the invention to provide a shielding device for a hearing aid which overcomes the above-mentioned disadvantages of the prior art devices of this general type, which is able to shield components against interference from the outside and vice versa.

According to the invention, the object is achieved in that a shielding device for a hearing aid is provided, the shielding device has at least three sections which are in each case connected to one another via a flexible connecting section. In this case, at least a first section has a printed circuit board which can be populated with at least one component, for example an SMD component, and/or an integrated circuit. In this case, the two other sections are folded around the first section by the flexible connecting sections, in order to shield the former.

Here, the shielding device has the advantage that the first section which, for example, can be populated with at least one SMD component or an integrated circuit, can be shielded against interference from the outside by the second and third sections folded around it. At the same time, the components and the integrated circuit on the first section can be shielded from the outside in such a way that they do not subject the surroundings to any interferences. For example, an oscillator as a clock generator and part of the integrated circuit can cause noise interference, which is at least reduced by the shielding device.

In one embodiment according to the invention, the shielding device has at least one continuous strip or two or more continuous strips arranged over one another. Here, the strips form at least three sections, of which at least one has a printed circuit board on at least one side. In each case a connecting section is provided between the three sections. It is used for the purpose of folding over the sections in this region or in order to fold them around the first section. The strip or the strips have the advantage that they are easy and inexpensive to produce. In the case of a plurality of strips, in each case one insulating layer or dielectric layer is arranged between them.

In a further embodiment according to the invention, at least one or two layers of strips are additionally arranged on at least one or both sides of the strip or on at least one or both outer sides of the strips. The strips of one layer are in this case dimensioned and positioned in such a way that they form the respective sections of the shielding device, while the flexible connecting sections remain free. In this way, the shielding device can be formed with a more solid structure in the region of the sections, while the connecting sections remain flexible. Here, an insulating layer is in each case provided between the strips, it being possible for the insulating layers between the strips to be varied as desired with regard to material and thickness, depending on function and intended purpose.

According to a further embodiment of the invention, the respective insulating layer has for example a plastic material, for example a polyimide or a liquid crystal polymer (LCP), or a fiber reinforced material, such as a glass fiber material. Depending on whether the shielding device is to be flexible or partly flexible, use is made either only of insulating layers of a plastic material, e.g. polyimide or, in the case of a partly flexible shielding device, at least one insulating layer of glass fiber material, for example. In the case of a rigid shielding device, for example insulating layers of materials such as a polyimide, for example, can be used only in the region of the flexible connecting sections. In this way, the level of flexibility of the shielding device can be controlled very simply.

In a further embodiment according to the invention, the strips or the sections and connecting sections are produced from metal or a metal alloy which provides suitable shielding for example against magnetic, electric and/or electromagnetic influences. In this case, the strips can have copper or gold, for example, or an appropriate alloy or be produced from the latter.

According to another embodiment of the invention, one or both sections, which form the top side and underside of the shielding device when folded together, are narrower than the section lying underneath them, so that at least one wire can be connected to the section lying underneath, which, for example, has a printed circuit board with at least one SMD component and/or an integrated circuit.

Other features which are considered as characteristic for the invention are set forth in the appended claims.

Although the invention is illustrated and described herein as embodied in a shielding device for a hearing aid, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

In all the figures, identical or functionally identical elements and devices—if nothing else is specified—have been provided with the same designations.

Figure 1:
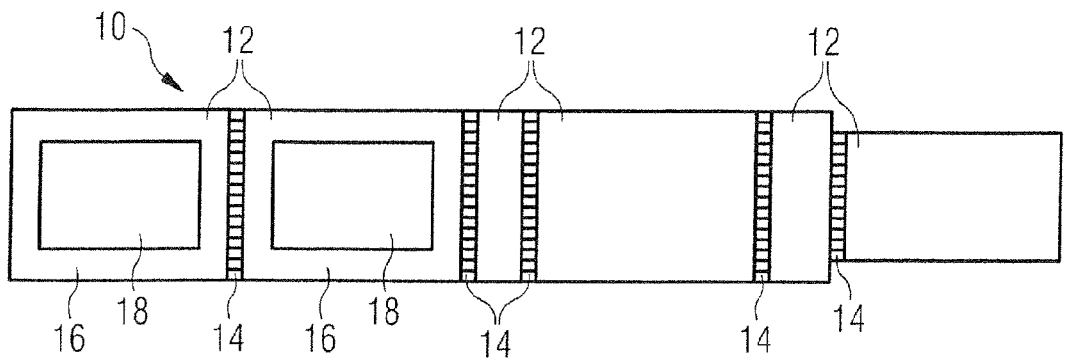
FIG. 1 is a diagrammatic, illustration of a first embodiment of a shielding device for a hearing aid.

Referring now to the figures of the drawing in detail and first, particularly, to FIG. 1 thereof, there is shown a shielding device 10 according to a first embodiment of the invention. In this case, the shielding device 10 contains a plurality of connected sections 12, which are connected to one another in each case by a connecting section 14 which, for example, is flexible. The first two of the six sections 12 in each case have, for example, a printed circuit board (PCB) 16 on their top side and bottom side. An integrated circuit (IC) 18 is for example provided on a circuit board 16 in each case of a section 12. On the other side of the respective section 12 it is moreover possible for one or more further components 20, for example SMD components, to be provided on the circuit board 16 there. The sections 12 having integrated circuits 18 and the components 20 can in this case form a type of hybrid component. The number of populated sections 12 and their population is in this case purely exemplary.

In order now to protect the integrated circuits 18 and the other components 20 from the outside for example against magnetic interference, for example as a result of a tele-coil or a non-illustrated wire-free coil, the first and second sections 12 having the printed circuit boards 16 are folded on to one another along the connecting section 14. Furthermore, the sections three to six are folded along the connecting sections 14, around the first and second sections 12 having the integrated circuits (IC) 18 and the components 20, in order to shield these off from the outside. In this case, the third and fifth sections 12 form the side faces of the shielding device 10, and the fourth and sixth sections 12 form the top side and underside of the shielding device 10. Here, for example, no additional components, such as SMD components and so on, are arranged on the outer sides of the third to sixth section 12, since they are used primarily as a shield against undesired magnetic, electric, electromagnetic and/or acoustic influences. The fourth and/or sixth section 12 can optionally be somewhat smaller in each case on one or both sides or formed with at least one recess in order to keep sufficient space free to be able to connect wires or cables 22 on the first and second section 12 having the printed circuit board 16, as shown in the perspective view in FIG. 3, as will be explained in more detail below.

Figure 2:
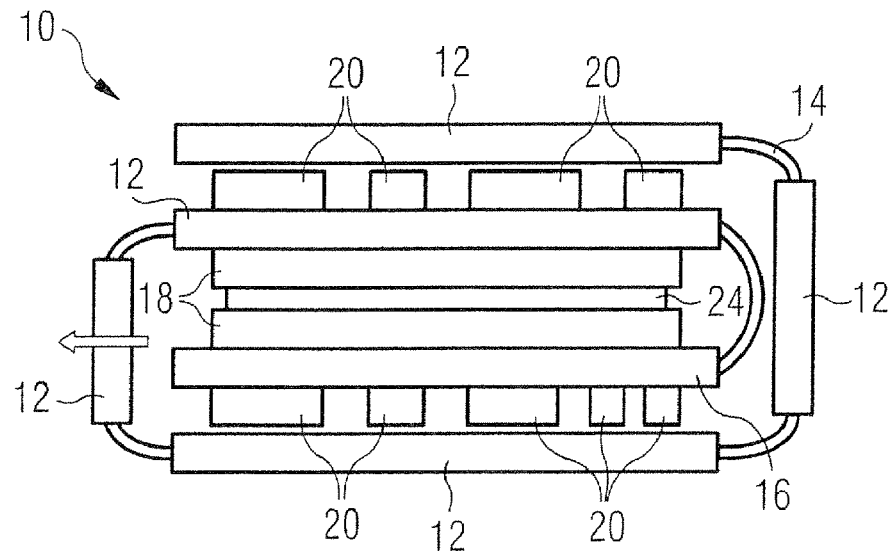
FIG. 2 is a diagrammatic, side view of the shielding device in a folded state.

In FIG. 2 the shielding device 10 is shown in a side view in the folded state. Here, the two first and second sections 12 having the integrated circuits (IC) 18 are folded onto each other. An isolating layer 24 can optionally additionally be arranged between the two sections 12 and the integrated circuits 18. The isolating layer 24 can in this case be formed of foam or a rubber material, for example. The isolating layer 24 is used to stop the two integrated circuits 18 coming into contact with each other in the present case, in order to prevent possible mutual damage to the circuits 18. As described previously, at least one or more further components 20 can be arranged on the other side of the first or second section 12, and vice versa. Such components 20 can be, for example, a clock generator such as an oscillator. However, this is merely an example of a large number of components 20 which can be fitted to the circuit boards 16. By the outer sections 12, the integrated circuits 18 and the other components 20 are protected against interfering magnetic, electric, electromagnetic and/or acoustic influences arising from external parts, such as a tele-coil or a wire-free coil. Furthermore, however, the external parts can also conversely be protected against magnetic, electric, electromagnetic and/or acoustic influences from the components 20 and circuits 18 of the two first sections 12. For example, the external parts can be protected against noise interference which, for example, is produced by an oscillator as clock generator which, for example, is part of the integrated circuit 18.

Figure 3:
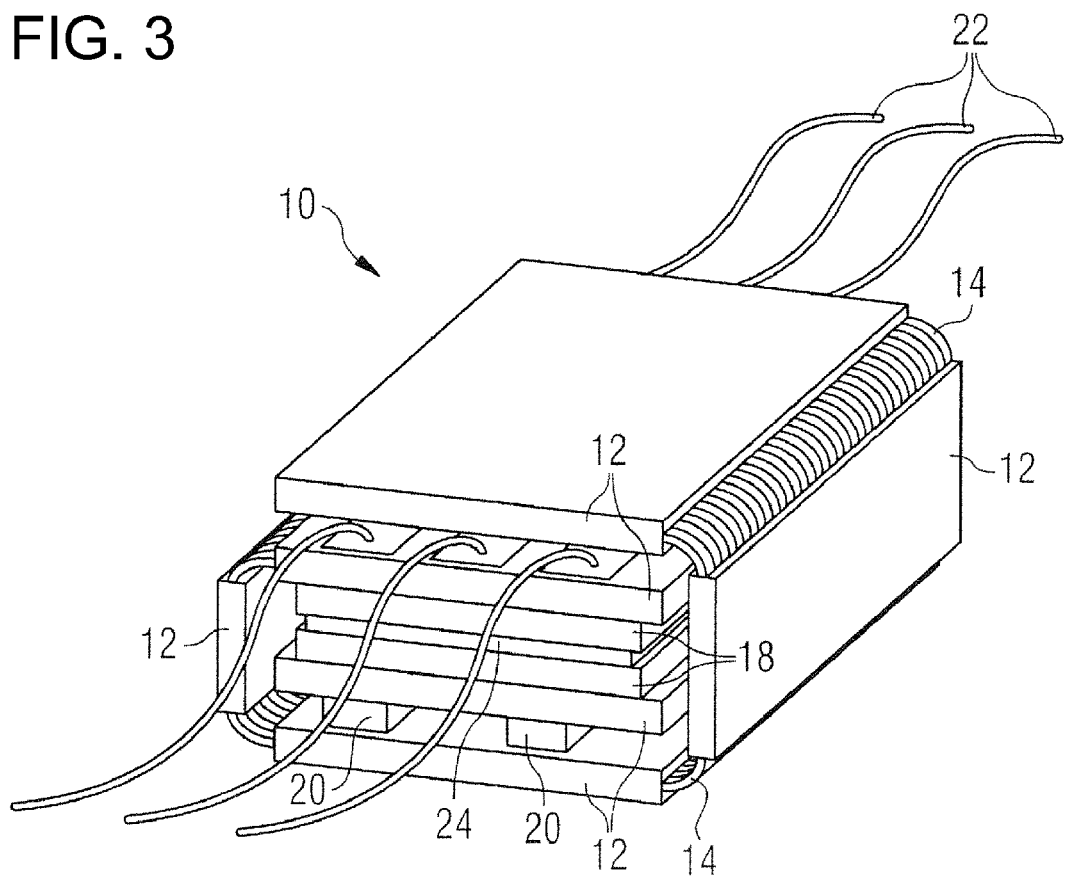
FIG. 3 is a diagrammatic, perspective view of the shielding device according to FIG. 2.

In FIG. 3 the shielding device 10 from FIG. 2 is shown in a perspective view. Here, on at least one side or on both sides here, the upper, sixth section 12 is formed so as to be somewhat narrower than the second section 12 lying underneath it. In this way, space remains free on both sides in order to connect wires or cables 22 to the second circuit board 16 and to connect these to the integrated circuit 18 or other components 20. Optionally, it is also possible for the lower, fourth section 12 to be formed in such a way that space remains free on one or both sides, so that wires or cables 22 can be connected in order to be connected to the other section 12 and its integrated circuit 18 or components 20.

Figure 4:
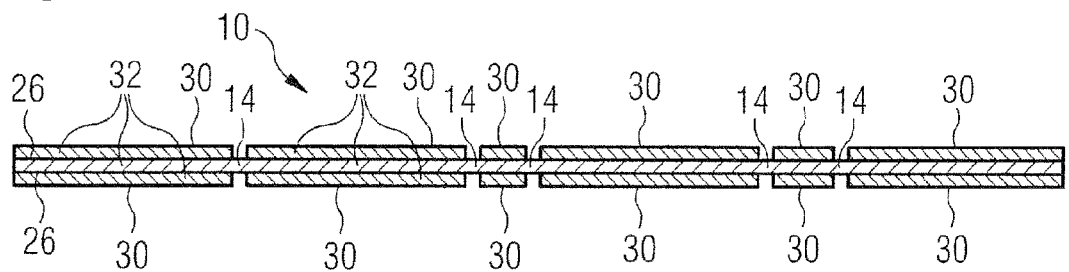
FIG. 4 is a diagrammatic, side view of the shielding device according to FIG. 1.

In this case, as shown in the first embodiment of the invention in FIG. 4, the shielding device 10 can contain two continuous strips 26 and in each case an additional layer 28 of strips 30 on each side. The additional strips 30 are dimensioned and positioned in such a way that they form the six sections 12 of the shielding device 10. In each case, sufficient space is left free between the strips 30 in order to ensure the flexible connecting section 14. Here, the strips 26, 30 can be of metal or a metal alloy. For example, the strips 26, 30 can be of copper, gold and so on or an appropriate metal alloy. Arranged between the copper strips in FIG. 4 is a dielectric layer, which serves as an insulating layer 32. At least one or all of the sections 12 can in this case be formed so as to be substantially fully flexible. In this case, the insulating layer 32, for example of polyimide or else LCP, is provided between the copper strips 26, 30 as a dielectric material. If, on the other hand, at least one or all of the sections 12 are formed so as to be partly flexible, then the insulating layer 32 of a plastic material, such as polyimide or LCP, is used for example between the strips 30 of the upper layer and the continuous strip 26 and also between the two continuous strips 26. On the other hand, between the strips 30 of the lower layer and the other continuous strip 26, the insulating layer 32 is chosen from a more solid material, for example a glass fiber material. However, this is merely one example of many of how the insulating layers 32 can be provided. As illustrated highly simplified in FIG. 4 and not to scale, the insulating layer 32 can be applied over the entire area between the strips 26, 30 or fitted only in sections of the strips (not illustrated). This applies to all the embodiments.

The respective flexible connecting section 14 between sections 12 is provided by part of the strips 26 being formed continuously, that is to say the strips 26 form both a part of the sections 12, which, for example, can be provided with one or more printed circuit boards 16, and at the same time the connection of the sections 12 to one another. As shown in FIG. 4, the flexible connecting sections 12 consist for example of two continuous copper strips, a likewise flexible plastic layer being arranged between them as an insulating layer 32.

The shielding device 10 can in this case for example be kept in its folded form by itself. Optionally, for example, it is also possible for a non-illustrated clip to be provided, between which the shielding device 10 is pushed in. Alternatively, it is also conceivable, for example, to bond or to solder the sixth section 12 to the second section 12. Optionally, it is also conceivable to insert the shielding device 10 into an appropriate holder in a non-illustrated housing, in which the shielding device is held. This applies to all the embodiments.

Figure 5:
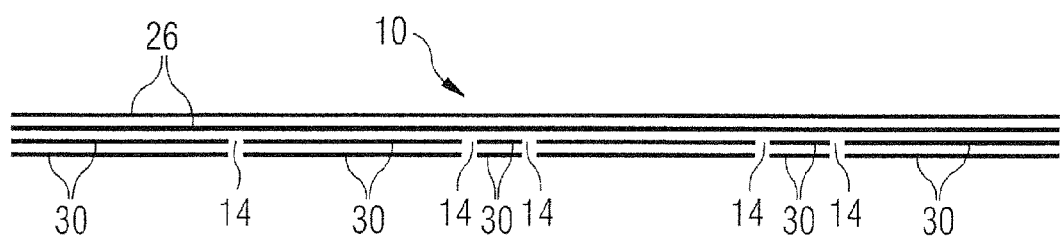
FIG. 5 is a diagrammatic, side view of the shielding device according to a second embodiment according to the invention.

A second embodiment of the shielding device 10 according to the invention is illustrated in FIG. 5. This differs from the first embodiment in the arrangement of the strips 26, 30. For reasons of clarity, the components and circuits which can be fixed to the circuit boards of the sections 12 have been left out. Furthermore, the illustration of the insulating layer which is arranged between the strips 26, 30 has also been left out. In this case, the shielding device 10 has two first and second continuous strips 26. Provided on one side in addition are two layers of strips 30, which are dimensioned and positioned in such a way that they form the sections 12 of the shielding device 10, which, for example, can in each case be provided with at least one printed circuit board 16. The strips 26, 30, as has already been described previously with reference to the first embodiment, are made of metal or a metal alloy, for example copper. Furthermore, an insulating layer is provided between the strips 26, 30. In this case, the insulating layer can be applied in sections or over the entire area between the strips 26, 30, as shown by way of example in FIG. 4.

Depending on whether the sections 12 are to be flexible, partly flexible or rigid, some or all the insulating layers are provided made of plastic, such as polyimide or LCP, or optionally one or more insulating layers, for example made of glass fiber material, as has already been described previously in detail with reference to FIG. 4.

Figure 6:
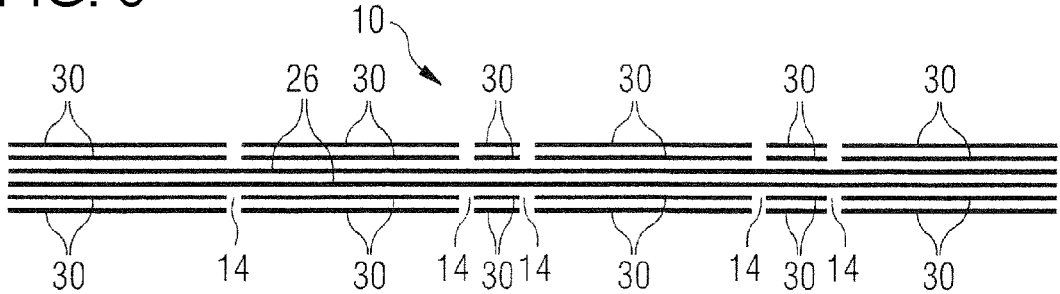
FIG. 6 is a diagrammatic, side view of the shielding device according to a third embodiment according to the invention.

Furthermore, a third embodiment according to the invention of the shielding device 10 is illustrated in FIG. 6, differing from the first and second embodiment substantially in the number and arrangement of the strips 26, 30. This has, for example, two continuous strips 26 and, in each case on both sides, two additional layers with strips 30. Here, the strips 30 are dimensioned and positioned such that they form sections 12 of the shielding device 10 and in each case leave a region free. The flexible connecting sections 14 are formed only by the continuous strips 26. Provided between the strips 26, 30 are the insulating layers described previously (not illustrated). In this case, as has already been described with reference to FIG. 4, the insulating layers can be varied in such a way that the shielding device 10 is flexible or partly flexible, for example.

The invention is not restricted to the present embodiments. The embodiments described previously can be combined with one another, in particular individual features thereof. Furthermore, the number, the arrangement and the dimensioning of continuous strips 26 and layers 28 of strips 30 can be varied as desired in order to provide sections 12, which are connected to one another by flexible connecting sections 14. Likewise, the insulating layers 32 between the strips 26, 30 can be varied as desired, for example with regard to thickness, material, distribution and so on.

The shielding device 10 according to the invention is suitable for hearing aids which, for example, comprise hearing devices for people with hearing problems, such as hardness of hearing, and any other type of hearing devices or hearing aids which are used for the transmission of acoustic signals. These include, for example, what are known as headsets such as are used in cell phones or even music replay devices, such as Walkmans or MP3 players and so on. However, the enumeration is purely exemplary and not final.

The invention claimed is:

1. A shielding device for a hearing aid, the shielding device comprising:
    flexible connecting sections; and
    at least three sections in each case connected to one another via one of said flexible connecting sections, at least a first section of said three sections having a printed circuit board to be populated with at least one of a component and an integrated circuit, a second and third section of said three sections being folded around said first section by means of said flexible connecting sections for shielding said first section.

2. The shielding device according to claim 1, further comprising at least one continuous first strip.

3. The shielding device according to claim 2, further comprising at least one layer of second strips disposed on said at least one continuous first strip, said second strips of said layer in each case forming said sections of the shielding device, while said flexible connecting sections between them, remain free.

4. The shielding device according to claim 2, further comprising insulating layers with one of said insulating layers disposed between each of said first and second strips.

5. The shielding device according to claim 4, wherein said insulating layers between said strips are the same with regard to at least one of a material, a thickness and a distribution.

6. The shielding device according to claim 4, wherein each of said insulating layers has a plastic material selected from the group consisting of a polyimide, a liquid crystal polymer, a fiber reinforced material, and a glass fiber material.

7. The shielding device according to claim 4, wherein said insulating layers between said strips in a region of said flexible connecting sections are formed of plastic.

8. The shielding device according to claim 4, wherein said insulating layers are formed from one of a plastic, a polyimide and a liquid crystal polymer resulting in a flexible shielding device.

9. The shielding device according to claim 4, wherein said insulating layer is formed of a material selected from the group consisting of a fiber reinforced material and a glass fiber material, in a region of said sections resulting in a semi-flexible shielding device.

10. The shielding device according to claim 1, wherein said strips, said sections and said flexible connecting sections are formed from a material selected from the group consisting of a metal, a metal alloy, copper and gold.

11. The shielding device according to claim 1, further comprising:
    a total of six of said sections, at least one of said first and second sections having said at least one printed circuit board on at least one side, said printed circuit board having at least one of said integrated circuit and said component; and
    an isolating layer, as two of said sections are folded onto each other, said isolating layer being disposed between them, said isolating layer formed of a material selected from the group consisting of a foam material and a rubber material.

12. The shielding device according to claim 11,
further comprising at least one wire; and
wherein said two sections, which form a top side and an underside of the shielding device when folded together, are narrower than said sections lying underneath them, at least on one side, so that said at least one wire is disposed on said section lying underneath.

13. The shielding device according to claim 1, wherein the shielding device is a shielding means for shielding said printed circuit board, which can be populated with at least one of said integrated circuit and said component, at least one of said sections shielding against magnetic, electric, electromagnetic and/or acoustic influences from outside of the shielding device and/or to the outside of the shielding device.

14. The shielding device according to claim 4, wherein said insulating layers between said strips are different with regard to at least one of a material, a thickness and a distribution.

15. The shielding device according to claim 4, wherein said insulating layers between said strips in a region of said flexible connecting sections are formed by one of a polyimide and a liquid crystal polymer.

16. The shielding device according to claim 11, wherein said component is a surface mounted component.

17. The shielding device according to claim 1, further comprising at least two continuous first strips disposed over one another.

18. The shielding device according to claim 17, further comprising at least two layers of second strips disposed on at least one or both sides of said first strips or on at least one or both outer sides of said first strips, said second strips of said layers in each case forming said sections of the shielding device, while said flexible connecting sections between them remain free.

19. The shielding device according to claim 17, further comprising an insulating layer disposed in each case between said strips.

20. A hearing aid, comprising:
    a shielding device containing:
    a printed circuit board;
    an integrated circuit;
    at least one component;
    flexible connecting sections; and
    at least three sections in each case connected to one another via one of said flexible connecting sections, at least a first section of said three sections having said printed circuit board populated with said component and said integrated circuit, a second and third section of said three sections being folded around said first section by means of said flexible connecting sections for shielding said first section.

* * * * *